(12) United States Patent
Miyamoto

(10) Patent No.: US 9,082,586 B2
(45) Date of Patent: Jul. 14, 2015

(54) CATHODE OPERATING TEMPERATURE ADJUSTING METHOD, AND WRITING APPARATUS

(71) Applicant: NuFlare Technology, Inc., Yokohama (JP)

(72) Inventor: Nobuo Miyamoto, Kanagawa (JP)

(73) Assignee: NuFlare Technology, Inc., Yokohama (JP)

( * ) Notice: Subject to any disclaimer, the term of this patent is extended or adjusted under 35 U.S.C. 154(b) by 0 days.

(21) Appl. No.: 14/186,366

(22) Filed: Feb. 21, 2014

(65) Prior Publication Data

US 2014/0239200 A1    Aug. 28, 2014

(30) Foreign Application Priority Data

Feb. 26, 2013    (JP) .................................. 2013-036257

(51) Int. Cl.
*H01J 37/304* (2006.01)
*H01J 37/317* (2006.01)
(Continued)

(52) U.S. Cl.
CPC ............... *H01J 37/304* (2013.01); *B82Y 10/00* (2013.01); *B82Y 40/00* (2013.01); *H01J 3/26* (2013.01); *H01J 37/06* (2013.01); *H01J 37/07* (2013.01);
(Continued)

(58) Field of Classification Search
CPC ............... H01J 2237/0653; H01J 2237/30461; H01J 37/06; H01J 37/304; H01J 37/3174; H01J 37/07; H01J 2237/24535; H01J 2237/24585

USPC .................................. 250/492.3, 310, 493.1
See application file for complete search history.

(56) References Cited

U.S. PATENT DOCUMENTS 3,783,325 A * 1/1974 Shelton ......................... 313/336
4,500,791 A * 2/1985 Beisswenger .............. 250/493.1
(Continued)

FOREIGN PATENT DOCUMENTS

| JP | 2010-62374 | 3/2010 |
| JP | 2012-18790 | 1/2012 |
| JP | 2012018790 A * | 1/2012 |

OTHER PUBLICATIONS

Office Action mailed Dec. 9, 2014 in Taiwanese Application No. 103102758 (w/English translation).
Office Action issued in Korean Application No. 10-2014-0021360 mailed on Mar. 9, 2015.

*Primary Examiner* — Michael Logie
*Assistant Examiner* — Wyatt Stoffa
(74) *Attorney, Agent, or Firm* — Oblon, McClelland, Maier & Neustadt, L.L.P.

(57) ABSTRACT

A cathode operating temperature adjusting method includes acquiring an approximate equation approximating a correlation between an emission current value in an electron beam source using a cathode and an operating temperature of the cathode at which a bias voltage becomes saturated at the emission current, measuring a current density of an electron beam from the cathode when in the state where an n-th emission current value and an n-th cathode operating temperature are set in the electron beam source, determining whether the measured current density is within a first tolerance range, changing the n-th emission current value to an (n+1)th emission current value when the measured current density is not within the first tolerance range, calculating an operating temperature of the cathode corresponding to the (n+1)th emission current value by the approximate equation, and setting the calculated operating temperature, as an (n+1)th cathode operating temperature, in the electron beam source.

9 Claims, 5 Drawing Sheets

(51) Int. Cl.
  *H01J 3/26* (2006.01)
  *H01J 37/07* (2006.01)
  *H01J 37/06* (2006.01)
  *B82Y 10/00* (2011.01)
  *B82Y 40/00* (2011.01)

(52) U.S. Cl.
  CPC ..... *H01J 37/3174* (2013.01); *H01J 2237/0653* (2013.01); *H01J 2237/24585* (2013.01); *H01J 2237/30461* (2013.01)

(56) References Cited

U.S. PATENT DOCUMENTS

| | | | |
|---|---|---|---|
| 6,559,662 B1* | 5/2003 | Yamada et al. | 324/754.22 |
| 2008/0067412 A1* | 3/2008 | Vanderberg et al. | 250/427 |
| 2008/0169743 A1* | 7/2008 | Fujieda et al. | 313/37 |
| 2013/0020940 A1* | 1/2013 | Becker et al. | 315/111.81 |
| 2013/0032716 A1* | 2/2013 | Nakasuji et al. | 250/310 |
| 2014/0097352 A1* | 4/2014 | Nakasuji | 250/396 R |
| 2014/0117839 A1* | 5/2014 | Saito | 313/421 |

* cited by examiner

CATHODE OPERATING TEMPERATURE ADJUSTING METHOD, AND WRITING APPARATUS

CROSS-REFERENCE TO RELATED APPLICATION

This application is based upon and claims the benefit of priority from the prior Japanese Patent Application No. 2013-036257 filed on Feb. 26, 2013 in Japan, the entire contents of which are incorporated herein by reference.

BACKGROUND OF THE INVENTION

1. Field of the Invention

The present invention relates to a method of adjusting a cathode operating temperature and to a writing apparatus. More specifically, for example, the present invention relates to a method of adjusting an operating temperature of a cathode of a beam source used in an electron beam writing apparatus.

2. Description of Related Art

In electron beam apparatuses, an electron gun is used as a beam source. As for the electron beam apparatuses, various apparatuses such as an electron beam writing apparatus and an electron microscope can be exemplified. With regard to an electron beam writing technology, for example, it intrinsically has excellent resolution and is used for producing a high-precision master pattern.

The lithography technique that advances miniaturization of semiconductor devices is extremely important since it is a sole process whereby patterns are formed in semiconductor manufacturing. In recent years, with high integration of LSI, the line width (critical dimension) required for semiconductor device circuits is decreasing year by year. For forming a desired circuit pattern on such semiconductor devices, a master or "original" pattern (also called a mask or a reticle) of high accuracy is needed. Then, the electron beam writing apparatus is used for producing such a high-precision master pattern.

FIG. 7 is a conceptual diagram for explaining operations of a variable shaped electron beam writing or "drawing" apparatus. As shown in the figure, the variable shaped electron beam (EB) writing apparatus operates as described below. A first aperture 410 has a quadrangular opening 411 for shaping an electron beam 330. A second aperture 420 has a variable-shape opening 421 for shaping the electron beam 330 having passed through the opening 411 of the first aperture 410 into a desired quadrangular shape. The electron beam 330 emitted from a charged particle source 430 and having passed through the opening 411 is deflected by a deflector to pass through a part of the variable-shape opening 421 of the second aperture 420, and thereby to irradiate a target object or "sample" 340 placed on a stage which continuously moves in one predetermined direction (e.g., the x direction) during the writing. In other words, a quadrangular shape that can pass through both the opening 411 and the variable-shape opening 421 is used for pattern writing in a writing region of the target object 340 on the stage continuously moving in the x direction. This method of forming a given shape by letting beams pass through both the opening 411 of the first aperture 410 and the variable-shape opening 421 of the second aperture 420 is referred to as a variable shaped beam (VSB) system.

In order to enhance throughput of electron beam writing apparatuses, it is absolutely necessary to increase beam current density. Then, in order to realize a high current density, it is necessary to set the cathode temperature of an electron gun to be a high temperature. However, if the cathode temperature is set high, since the evaporation speed of the cathode material increases, the cathode tip shape changes during writing. Therefore, the high temperature setting has its own limit.

Regarding the current density, it is adjusted by controlling an emission current composed of electrons emitted from the cathode. In the conventional electron beam writing apparatus, the electron gun is controlled so that an initially set emission current may always be constant. If writing is performed by this control method under high current density conditions, the optimum cathode operating temperature for the initially set emission current changes due to the change of the cathode tip shape and the like (degradation of the cathode). Therefore, after the cathode deteriorates, the emission current becomes unstable when the initially set cathode operating temperature is kept to be used. Then, it becomes necessary, in such a state of the cathode, to newly acquire an optimum cathode operating temperature for obtaining a stable emission current. However, if the cathode temperature is changed, the current density also changes. Then, if the current density changes, the dose to the target object also changes, which causes a problem of degrading the writing precision of patterns. Therefore, it is necessary to maintain current density.

Then, in order to maintain a desired current density, the emission current needs to be adjusted each time according to the degradation state of the cathode. However, if the emission current is adjusted, since the optimum operating temperature of the cathode also changes, it becomes necessary to newly optimize the cathode temperature. Furthermore, if the cathode temperature is changed, the current density also changes again. Thus, in order to obtain a desired current density, it becomes necessary to optimize the emission current and the cathode temperature while repeatedly performing adjustment of the emission current and the cathode temperature each time according to the degradation state of the cathode. Therefore, there is a problem in that the adjustment takes time. Particularly, there is a problem in that optimization of the cathode temperature at the time of adjusting the emission current takes time.

The inventor of the present invention has proposed a technique of optimizing an emission current and a cathode temperature for a desired current density at the time of starting up the apparatus, by respectively measuring and plotting an optimum cathode operating temperature at each of various emission current values at the stage when the apparatus is started up and before the cathode deteriorates (refer to, e.g., Japanese Patent Application Laid-open (JP-A) No. 2010-62374). However, this plot data does not fit after the cathode deteriorates.

BRIEF SUMMARY OF THE INVENTION

In accordance with one aspect of the present invention, a cathode operating temperature adjusting method includes acquiring an approximate equation that approximates a correlation between a value of an emission current in an electron beam source using a cathode and an operating temperature of the cathode at which a bias voltage becomes saturated at the emission current; measuring a current density of an electron beam emitted from the cathode when in a state in which an n-th emission current value, where n is a natural number, and an n-th operating temperature of the cathode are set in the electron beam source; determining whether the current density measured is within a range of a first tolerance; changing the n-th emission current value, which has been set, to an (n+1)th emission current value when the current density measured is not within the range of the first tolerance; calculating an operating temperature of the cathode corresponding to the (n+1)th emission current value by using the approximate equation; and setting the operating temperature calculated, as an (n+1)th operating temperature of the cathode, in the electron beam source.

In accordance with another aspect of the present invention, an electron beam writing apparatus includes an electron beam source using a cathode; a storage unit configured to store at least one of an approximate equation that approximates a correlation between a value of an emission current in the electron beam source and an operating temperature of the cathode at which a bias voltage becomes saturated at the emission current, and a coefficient of the approximate equation; a determination unit configured to determine whether a current density of an electron beam emitted from the cathode is within a range of a first tolerance when in a state in which an n-th emission current value, where n is a natural number, and an n-th operating temperature of the cathode are set in the electron beam source; an emission current setting change unit configured to change the n-th emission current value, which has been set, to an (n+1)th emission current value when the current density is not within the range of the first tolerance; an acquisition unit configured to acquire an operating temperature of the cathode corresponding to the (n+1)th emission current value by using the approximate equation; an operating temperature setting change unit configured to change the n-th operating temperature, which has been set in the electron beam source, to the operating temperature acquired as an (n+1)th operating temperature; and a writing unit configured to write a pattern on a target object with an electron beam whose current density is in the range of the first tolerance.

DETAILED DESCRIPTION OF THE INVENTION

In the following embodiments, there will be described an apparatus and method that can optimize a cathode temperature of an electron gun in a short time when adjusting an emission current in order to obtain a desired current density.

First Embodiment

Figure 1:
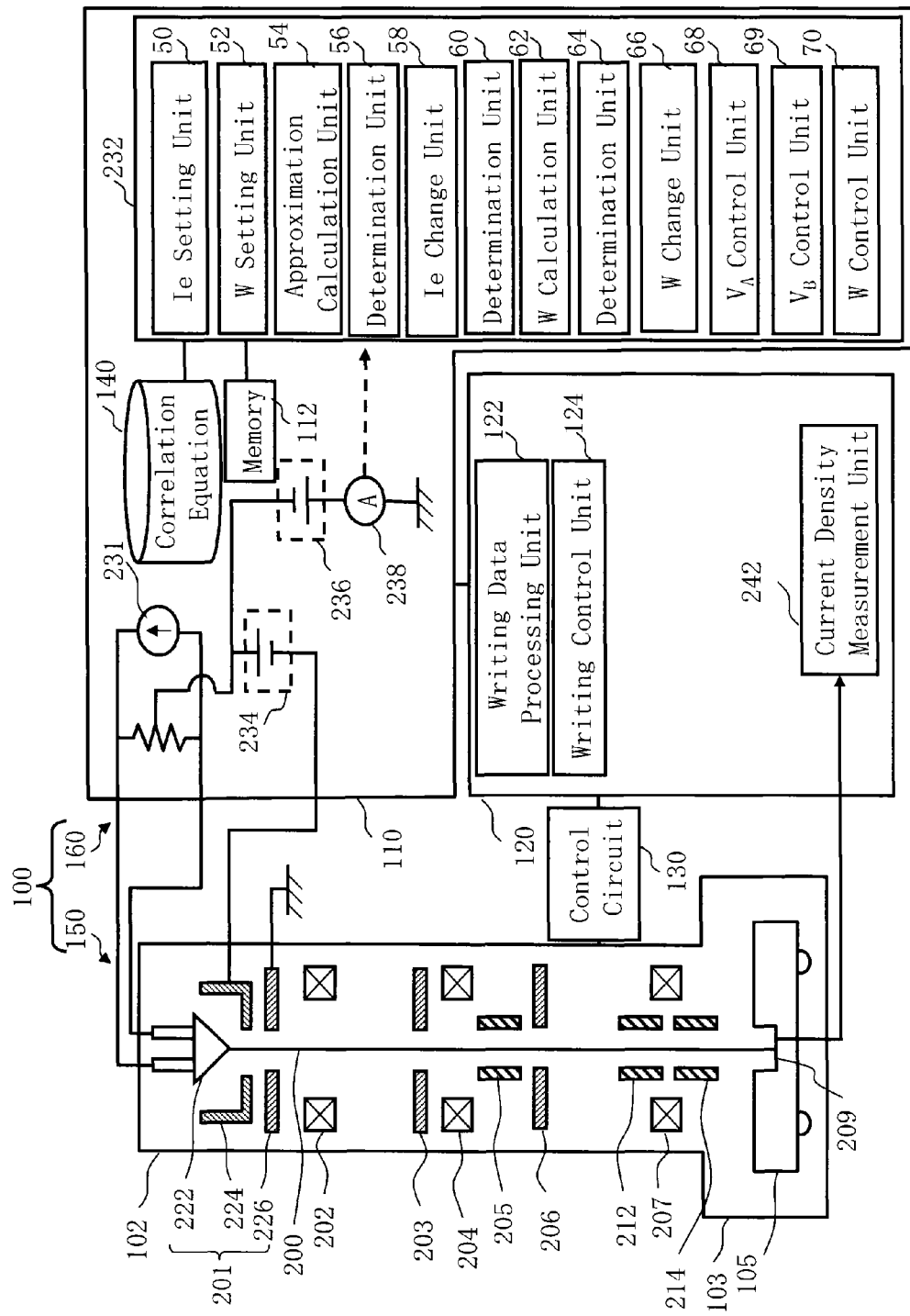
FIG. 1 is a schematic diagram showing a configuration of a writing apparatus according to the first embodiment.

FIG. 1 is a schematic diagram showing the configuration of a writing apparatus according to the first embodiment. In FIG. 1, a writing (or "drawing") apparatus 100 includes a writing unit 150 and a control unit 160. The writing apparatus 100 is an example of an electron beam writing apparatus, and, writes a desired pattern on a target object. The writing unit 150 includes an electron optics column 102 and a writing chamber 103. In the electron optics column 102, there are arranged an electron gun 201, an illumination lens 202, a first aperture 203, a projection lens 204, a shaping deflector 205, a second aperture 206, an objective lens 207, a sub deflector 212 and a main deflector 214. In the writing chamber 103, there is a movably arranged XY stage 105, on which a beam absorption electrode (a Faraday cup 209) for measuring the current of an electron beam 200 is arranged. The electron gun 201 includes a cathode 222, a Wehnelt 224 (a Wehnelt electrode), and an anode 226 (an anode electrode). The anode 226 is grounded (earthed). On the XY stage 105, a target object or "sample" to be written is placed when performing writing. The target object is, for example, an exposure mask substrate used for transferring a pattern onto a wafer. The mask substrate may be, for example, a mask blank on which resist is applied and no pattern has yet been written.

The control unit 160 includes an electron gun power unit 110, a writing control circuit 120, and a control circuit 130. The electron gun power unit 110, the writing control circuit 120, and the control circuit 130 are connected with each other by a bus (not shown).

In the electron gun power unit 110, there are arranged a control computer 232, a memory 112, a storage device 140 such as a magnetic disk drive, an acceleration voltage power circuit 236, a bias voltage power circuit 234, a filament power supply circuit 231 (a filament power supply unit), and an ammeter 238. The memory 112, the storage device 140, the acceleration voltage power circuit 236, the bias voltage power circuit 234, the filament power supply circuit 231, and the ammeter 238 are connected to the control computer 232 by a bus (not shown). An electron gun device (electron beam source) includes the electron gun 201 and the electron gun power unit 110.

In the control computer 232, there are arranged an emission current Ie setting unit 50, a filament power W setting unit 52, an approximation calculation unit 54, a determination unit 56, an emission current Ie change unit 58, a determination unit 60, a filament power W calculation unit 62, a determination unit 64, a filament power W change unit 66, an acceleration voltage $V_A$ control unit 68, a bias voltage $V_B$ control unit 69, and a filament power W control unit 70. Each function of the units described above may be configured by hardware such as an electronic circuit or by software such as a program causing a computer to implement these functions. Alternatively, it may be configured by a combination of hardware and software. Data which is input and output to/from the emission current Ie setting unit 50, the filament power W setting unit 52, the approximation calculation unit 54, the determination unit 56, the emission current Ie change unit 58, the determination unit 60, the filament power W calculation unit 62, the determination unit 64, the filament power W change unit 66, the acceleration voltage $V_A$ control unit 68, the bias voltage $V_B$ control unit 69 and the filament power W control unit 70, and data being calculated are stored in the memory 112 each time.

The negative electrode (−) side of the acceleration voltage power circuit 236 is connected to both electrodes of the cathode 222 in the electron optics column 102. The positive electrode (+) side of the acceleration voltage power circuit 236 is earthed (grounded) through the ammeter 238 connected in series. Moreover, the negative electrode (−) of the acceleration voltage power circuit 236 is branched and also connected to the positive electrode (+) of the bias voltage power circuit 234, and the negative electrode (−) of the bias voltage power circuit 234 is electrically connected to the Wehnelt 224 arranged between the cathode 222 and the anode 226. In other words, the bias voltage power circuit 234 is arranged to be electrically connected between the negative electrode (−) of the acceleration voltage power circuit 236 and the Wehnelt 224. Then, the filament power supply circuit 231 controlled by the filament power W control unit 70 supplies a current between both electrodes of the cathode 222 in order to heat the cathode 222 to a predetermined temperature. In other words, the filament power supply circuit 231 supplies a filament power W to the cathode 222. The filament power W and the cathode temperature can be defined by a certain relation, and the cathode can be heated to a desired cathode temperature by the filament power W. Thus, the cathode temperature is controlled by the filament power W. The filament power W is defined by the product of a current flowing between both electrodes of the cathode 222 and a voltage applied between both electrodes of the cathode 222 by the filament power supply circuit 231. The acceleration voltage power circuit 236 controlled by the acceleration voltage $V_A$ control unit 68 applies an acceleration voltage between the cathode 222 and the anode 226. The bias voltage power circuit 234 controlled by the bias voltage $V_B$ control unit 69 applies a negative bias voltage to the Wehnelt 224.

In the writing control circuit 120, there are arranged a writing data processing unit 122, a writing control unit 124, and a current density measurement unit 242. Each function, such as the writing data processing unit 122, the writing control unit 124, and the current density measurement unit 242 maybe configured by hardware such as an electronic circuit or by software such as a program causing a computer to implement these functions. Alternatively, it may be configured by a combination of hardware and software. Data which is input and output to/from the writing data processing unit 122, the writing control unit 124, and the current density measurement unit 242, and data being calculated are stored in a memory (not shown) each time.

FIG. 1 shows a configuration necessary for explaining the first embodiment. Other configuration elements generally necessary for the writing apparatus 100 may also be included.

Figure 2:
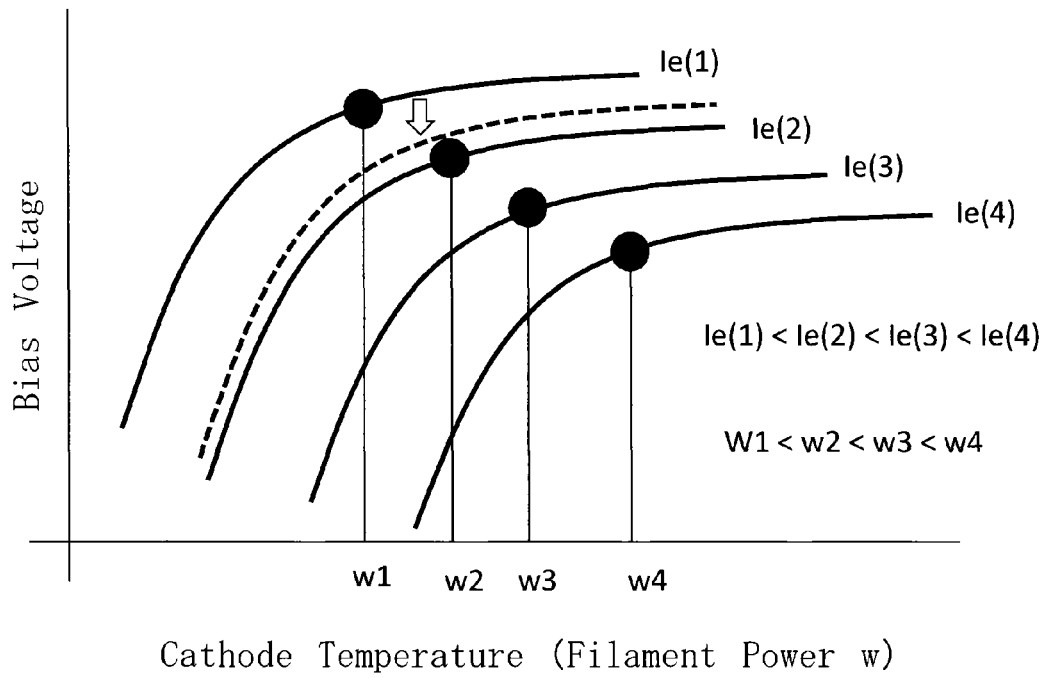
FIG. 2 is a graph showing a relation between an emission current and a filament power according to the first embodiment.

FIG. 2 is a graph showing a relation between an emission current and a filament power according to the first embodiment. As described above, the cathode temperature is determined by the filament power W. Therefore, in the control system, the cathode temperature is controlled by the filament power W. The cathode optimum operating temperature of an emission current Ie can be obtained by bias saturation characteristics. If the bias voltage and the filament power W (the cathode temperature) are increased with respect to the emission current Ie, the bias voltage will become saturated at some stage. The optimum operating temperature of the cathode at the emission current Ie can be defined by the filament power (the cathode temperature) at the value of 99.6%, for example, of the maximum bias voltage obtained by gradually increasing the filament power. If setting the cathode operating temperature lower than the cathode optimum operating temperature, the emission current Ie becomes unstable and thus, a stable beam current cannot be acquired, thereby deteriorating the precision of writing. If increasing the emission current Ie from emission current Ie (1) to emission current Ie (4) as shown in FIG. 2, in connection with this, the optimum filament power (the cathode optimum operating temperature) becomes higher, for example, from W1 to W4. If another cathode has the same state as the one described above, the same relation between an emission current and an optimum filament power can also be obtained with respect to the another cathode. If the cathode deteriorates, the bias saturation characteristic in each emission current Ie changes. For example, with respect to the emission current Ie (1), the bias saturation characteristic changes from the graph of the solid line to the graph of the dotted line of FIG. 2. The cathode optimum operating temperature also changes in accordance with this change.

Figure 3:
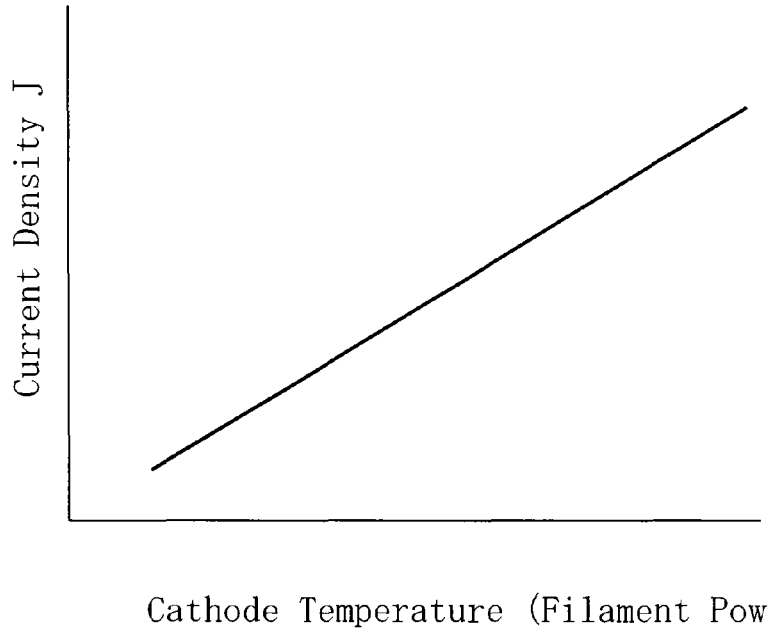
FIG. 3 is a conceptual diagram showing a relation between a current density and a filament power according to the first embodiment.

FIG. 3 is a conceptual diagram showing a relation between a current density and a filament power according to the first embodiment. The relation between them in FIG. 3 is that the current density J changes when the filament power (the cathode temperature) changes. Although the straight line slants upward to the right, as this is just an example for convenience, it is not limited thereto.

As described above, when the cathode deteriorates, the bias saturation characteristic in each emission current Ie changes. Furthermore, the current density J changes with the change of the filament power (the cathode temperature). Therefore, it is necessary to obtain, in accordance with degradation of the cathode 222, the emission current Ie and its optimum filament power (the optimum cathode operating temperature) that enable to acquire a desired current density J. However, as described above, it takes time to optimize an emission current Ie and a filament power (cathode operating temperature) that enable to obtain a desired current density J. Then, according to the first embodiment, each step described below is executed for reducing such time.

Figure 4:
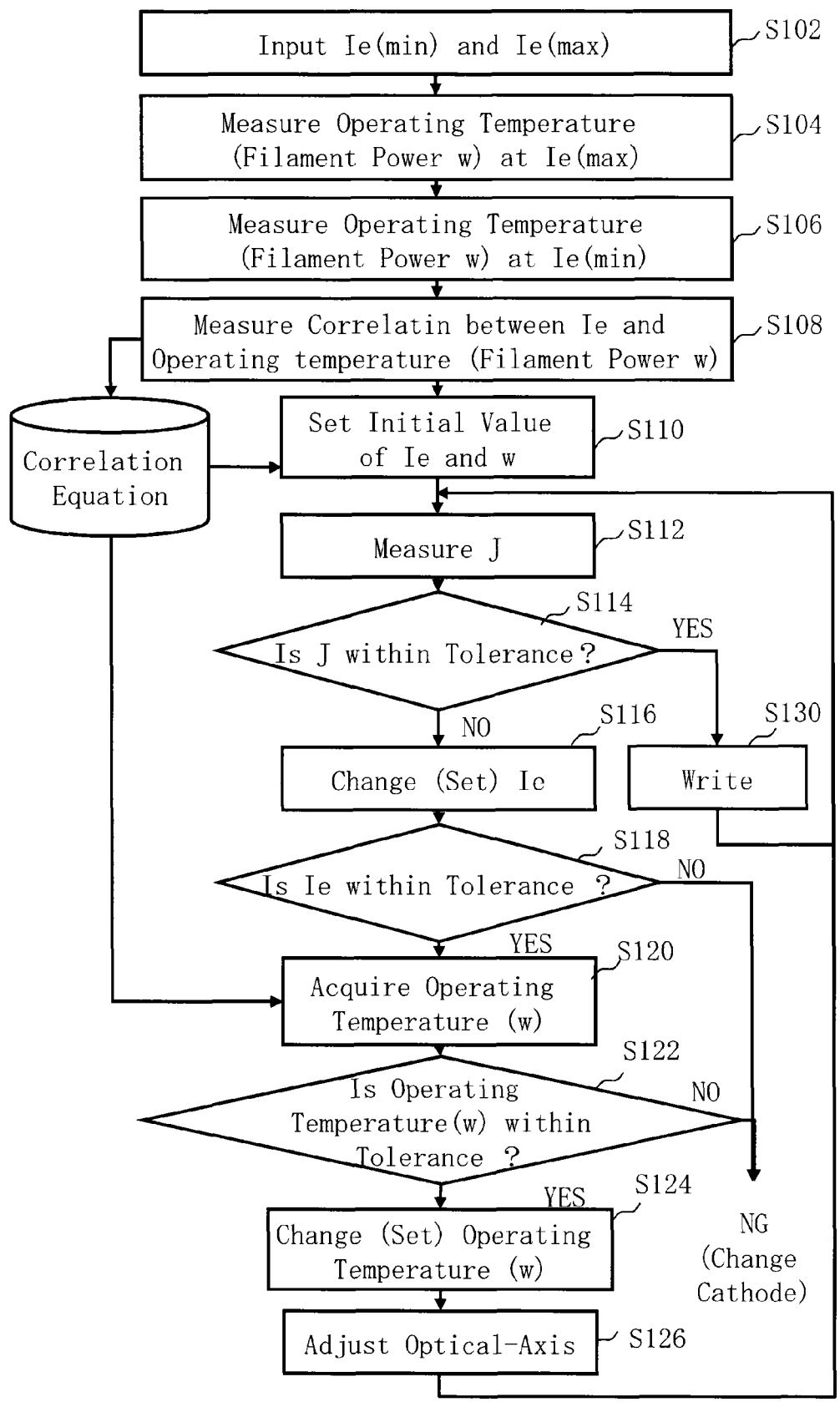
FIG. 4 is a flowchart showing main steps of a writing method according to the first embodiment.

FIG. 4 is a flowchart showing main steps of a writing method according to the first embodiment. In FIG. 4, the writing method according to the first embodiment executes each step of a cathode operating temperature adjusting method, and a writing step (S130). The method of adjusting a cathode operating temperature executes a series of steps as its internal steps: an input step (S102) of maximum emission current $Ie_{(max)}$ and minimum emission current $Ie_{(min)}$, an operating temperature measurement step (S104) at maximum emission current $Ie_{(max)}$, an operating temperature measurement step (S106) at minimum emission current $Ie_{(min)}$, an acquisition step (S108) of correlation equation between emission current Ie and operating temperature, an initial value setting step (S110), a current density J measurement step (S112), a determination step (S114), an emission current Ie change (setting) step (S116), a determination step (S118), an operating temperature (filament power W) acquisition step (S120), a determination step (S122), an operating temperature (filament power W) change (setting) step (S124), and an optical-axis adjustment step (S126).

In the input step (S102) of maximum emission current $Ie_{(max)}$ and minimum emission current $Ie_{(min)}$, the emission current Ie setting unit 50 inputs values of a permissible maximum emission current $Ie_{(max)}$ and a permissible minimum emission current $Ie_{(min)}$.

In the operating temperature measurement step (S104) at maximum emission current $Ie_{(max)}$, the emission current Ie setting unit 50 sets an inputted maximum emission current $Ie_{(max)}$ as a target value. Then, a cathode operating temperature (filament power W) at which the bias voltage becomes saturated at the permissible maximum emission current value $Ie_{(max)}$ is measured. Specifically, the acceleration voltage power circuit 236 controlled by the acceleration voltage $V_A$ control unit 68 applies an acceleration voltage between the cathode 222 and the anode 226. Then, the filament power W is supplied to the cathode 222 from the filament power supply circuit 231 controlled by the filament power W control unit 70. In such a state, the bias voltage power circuit 234 controlled by the bias voltage $V_B$ control unit 69 adjusts a negative bias voltage to be applied to the Wehnelt 224 so that the current value detected by the ammeter 238 may become a maximum emission current $Ie_{(max)}$. A group of the filament power W and the bias voltage, by which a current value detected by the ammeter 238 becomes the maximum emission current $Ie_{(max)}$, is serially measured until the bias voltage becomes saturated, by respectively varying the filament power W and the bias voltage.

Figure 5:
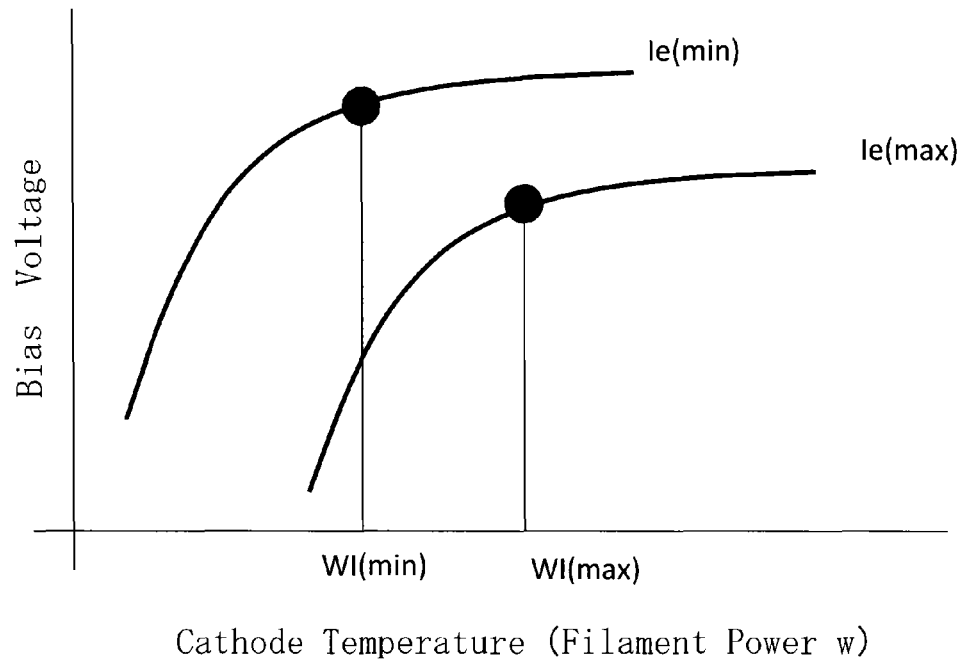
FIG. 5 is a graph showing a relation between a bias voltage and a cathode temperature (filament power W) at the maximum emission current $Ie_{(max)}$ and the minimum emission current $Ie_{(min)}$ according to the first embodiment.

FIG. 5 is a graph showing a relation between a bias voltage and a cathode temperature (filament power W) at the maximum emission current $Ie_{(max)}$ and the minimum emission current $Ie_{(min)}$ according to the first embodiment. If a group of the filament power W and the bias voltage, by which the maximum emission current $Ie_{(max)}$ is obtained, is serially measured by respectively varying the filament power W and the bias voltage, the bias voltage becomes saturated as shown in FIG. 5 regardless of the cathode temperature (filament power W) with respect to the case where the cathode temperature (filament power W) is higher than a certain temperature (electric power). The optimum operating temperature (filament power $W_{I(max)}$) of the cathode at the maximum emission current $Ie_{(max)}$ can be defined by the filament power (the cathode temperature) at the value of 99.6%, for example, of the maximum bias voltage obtained by gradually increasing the filament power.

In the operating temperature measurement step (S106) at minimum emission current $Ie_{(min)}$, the emission current Ie setting unit 50 sets an inputted minimum emission current $Ie_{(min)}$ as a target value. Then, a cathode operating temperature (filament power W) at which the bias voltage becomes saturated at the permissible minimum emission current value $Ie_{(min)}$ is measured. Specifically, the acceleration voltage power circuit 236 controlled by the acceleration voltage $V_A$ control unit 68 applies an acceleration voltage between the cathode 222 and the anode 226. Then, the filament power W is supplied to the cathode 222 from the filament power supply circuit 231 controlled by the filament power W control unit 70. In such a state, the bias voltage power circuit 234 controlled by the bias voltage $V_B$ control unit 69 adjusts a negative bias voltage to be applied to the Wehnelt 224 so that the current value detected by the ammeter 238 may become a minimum emission current $Ie_{(min)}$. A group of the filament power W and the bias voltage, by which a current value detected by the ammeter 238 becomes the minimum emission current $Ie_{(min)}$ is serially measured until the bias voltage becomes saturated, by respectively varying the filament power W and the bias voltage.

As shown in FIG. 5, the bias voltage becomes saturated regardless of the cathode temperature (filament power W) with respect to the case where the cathode temperature (filament power W) is higher than a certain temperature (electric power). The optimum operating temperature (filament power $W_{I(min)}$) of the cathode at the minimum emission current $Ie_{(min)}$ can be defined by the filament power (the cathode temperature) at the value of 99.6%, for example, of the maximum bias voltage obtained by gradually increasing the filament power.

In the acquisition step (S108) of correlation equation between emission current Ie and operating temperature, the approximation calculation unit 54 acquires an approximate equation that approximates a correlation between an emission current value and a cathode operating temperature at which the bias voltage becomes saturated at the emission current. In other words, the approximation calculation unit 54 performs a calculation for acquiring the approximate equation. The approximate equation is obtained by using a cathode operating temperature corresponding to a maximum emission current value and a cathode operating temperature corresponding to a minimum emission current value.

Figure 6:
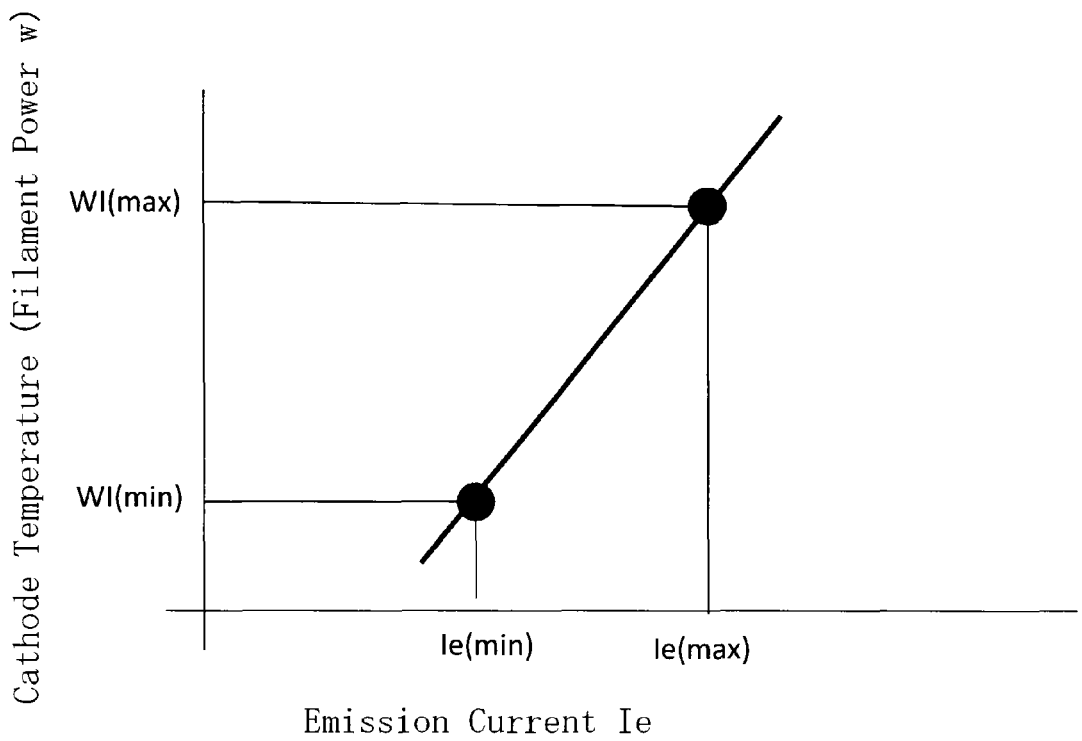
FIG. 6 is a graph showing an example of a correlation between an emission current Ie and an operating temperature according to the first embodiment.
Figure 7:
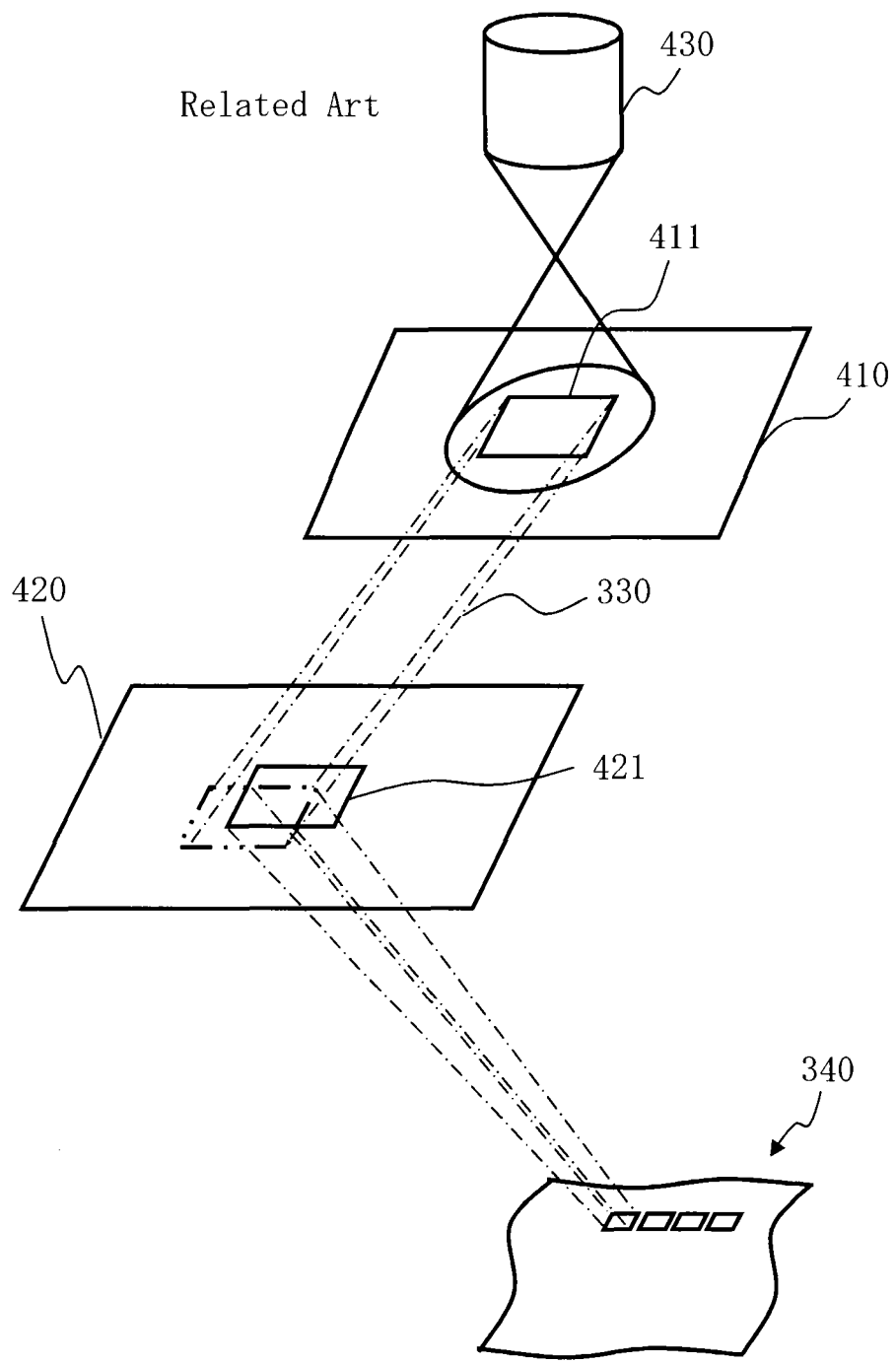
FIG. 7 is a conceptual diagram for explaining operations of a variable shaped electron beam writing apparatus.

FIG. 6 is a graph showing an example of a correlation between an emission current Ie and an operating temperature according to the first embodiment. In FIG. 6, the ordinate axis shows a cathode temperature (filament power W) and the abscissa axis shows an emission current Ie. According to the first embodiment, as shown in FIG. 6, an approximate equation (1) is defined by a primary polynomial which is obtained by fitting a result of measuring cathode operating temperatures (filament power W) corresponding to both the emission current values Ie of the maximum emission current $Ie_{(max)}$ and the minimum emission current $Ie_{(min)}$.

$$W = a \cdot Ie + b \qquad (1)$$

The obtained approximate equation (1) or coefficients "a" and "b" of the approximate equation (1) are stored in the storage device 140 (storage unit). According to the first embodiment, since the approximation is performed with respect to the maximum emission current $Ie_{(max)}$ and the minimum emission current $Ie_{(min)}$, it is possible to avoid measuring an optimum cathode operating temperature at various emission currents Ie. The measuring time can be shortened by reducing the number of emission currents Ie used for optimizing an optimum cathode operating temperature. By obtaining the approximate equation (1) to be in accordance with the state of degradation of the cathode 222, it is possible to acquire in a shorter time a correlation equation between an emission current Ie and an operating temperature at that point.

In the initial value setting step (S110), the emission current Ie setting unit 50 sets the initial value of the emission current Ie, that is the first (n=1) emission current Ie. It is preferable to set, as the initial value of the emission current Ie, a value experientially expected to be equivalent to a desired current density J. However, the initial value of the emission current Ie is not limited to this, and may be the minimum emission current $Ie_{(min)}$ or the maximum emission current $Ie_{(max)}$, for example. Similarly, the filament power W setting unit 52 sets the initial value (the first (n=1) filament power W) of a cathode operating temperature (filament power W) corresponding to the initial value of the emission current Ie. The initial value of the operating temperature (filament power W) of the cathode can be calculated by substituting the initial value of the emission current Ie into the approximate equation (1) described above.

In the current density J measurement step (S112), the current density J of an electron beam emitted from the cathode 222 is measured in the state in which the n-th emission current value and the n-th operating temperature of the cathode 222, where n is a natural number, are set in the electron gun device. Here, first, the current density J of an electron beam emitted from the cathode 222 is measured in the state in which the initial value (n=1) of the emission current value and the initial value (n=1) of the operating temperature (filament power W) of the cathode are set in the electron gun device. Specifically, the acceleration voltage power circuit 236 controlled by the acceleration voltage $V_A$ control unit 68 applies an acceleration voltage between the cathode 222 and the anode 226. Then, the filament power supply circuit 231 controlled by the filament power W control unit 70 supplies the initial value (n=1) of the filament power W to the cathode 222. In such a state, the bias voltage power circuit 234 controlled by the bias voltage $V_B$ control unit 69 adjusts a negative bias voltage to be applied to the Wehnelt 224 so that a current value detected by the ammeter 238 may become the initial value (n=1) of the emission current value. As described above, the electron beam 200 is emitted from the electron gun 201. Then, the current density measurement unit 242 measures the current density J of the electron beam 200. That is, the Faraday cup 209 receives all the beams having passed the first shaping aperture 203 whose opening size is fixed. Specifically, the electron beam 200 beam emitted from the electron gun 201 irradiates the first shaping aperture 203 by the illumination lens 202. The shaping deflector 205 deflects the electron beam 200 so that the first shaping aperture 203 image, which has passed the first shaping aperture 203, may not be blocked by the second shaping aperture 206. Then, beam currents of all the beams that have passed the second shaping aperture 206 are measured by the Faraday cup 209. An output of the Faraday cup 209 is transmitted to the current density measurement unit 242. In the current density measurement unit 242, the current density J is calculated by dividing the first shaping aperture current value by the area of the opening of the first shaping aperture 203. By measuring the first shaping aperture current, it is possible to avoid that the change (noise) of the projection lens 204 or the shaping deflector 205 badly affects the precision of calculating the current density.

Although, in the example described above, the current density J is calculated from all the beams that have passed the first shaping aperture 203, it is not limited thereto. For example, a beam of one μm square is shaped by the first shaping aperture 203 and the second shaping aperture 206. Then, the shaped beam may be measured by the Faraday cup 209. The current density J can be obtained by dividing a beam current value by the area of this shaped beam. Thus, it is possible to measure the current density J by determining, in advance, the area to be shaped.

In the determination step (S114), the determination unit 56 determines whether the measured current density is within a tolerance range (a range of a first tolerance). When the current density is not within the tolerance range, it proceeds to the emission current Ie change (setting) step (S116), and when it is within a tolerance range, it proceeds to the writing step (S130).

In the emission current Ie change (setting) step (S116), when the current density is not within a tolerance range, the n-th emission current value which was set is changed to the (n+1)th emission current value. When the initial value (n=1) has already been set, it is changed into the second emission current value.

In the determination step (S118), the determination unit 60 determines whether the (n+1)th emission current value, changed from the n-th emission current value, is within a tolerance range (a range of a third tolerance) or not. Generally, an emission current value is variably controlled so that the second emission current value may be within the tolerance, however, there is a possibility that the changed emission current value will be out of tolerance at some stage due to repeatedly performing the change. If the (n+1)th emission current value, changed from the n-th emission current value, is not within the tolerance, the processing ends as "NG". Then, for example, change of the cathode 222 is performed. When the (n+1)th emission current value is within a tolerance, it proceeds to the operating temperature (filament power W) acquisition step (S120).

In the operating temperature (filament power W) acquisition step (S120), the filament power W calculation unit 62 calculates the (n+1)th cathode operating temperature corresponding to the (n+1)th emission current value, changed from the n-th emission current value, using the approximate equation (1). The filament power W calculation unit 62 calculates a filament power W by reading the approximate equation (1) or coefficients "a" and "b" from the storage device 140 and substituting the (n+1)th emission current value Ie into the approximate equation (1). As described above, according to the first embodiment, the filament power W can be immediately calculated from the approximate equation (1). Therefore, it becomes unnecessary to obtain a saturation curve of the bias voltage by repeating to measure a group of a bias voltage and a filament power W every time the emission current value Ie is changed as conventionally performed. Therefore, optimization of the filament power W can be attained in a short time at each time of changing the emission current value Ie.

In the determination step (S122), the determination unit 64 determines whether the calculated operating temperature (filament power W) of the cathode is within a tolerance range (a range of a second tolerance). Generally, the calculated second filament power W is expected to be within the tolerance, however, there is a possibility that a corresponding operating temperature (filament power W) will be out of the tolerance at some stage due to repeatedly changing the emission current. When the calculated operating temperature (filament power W) is not within the tolerance, processing ends as "NG". The operating temperature of the cathode 222 to be set in the electron gun device (the electron beam source) is adjusted in the range of tolerance (the range of the second tolerance). For example, change of the cathode 222 is performed. When the calculated operating temperature (filament power W) is within a tolerance, it proceeds to the operating temperature (filament power W) change (setting) step (S124).

In the operating temperature (filament power W) change (setting) step (S124), the filament power W change unit 66 (an operating temperature setting change unit) changes the n-th operating temperature (filament power W), which is currently set, to a calculated operating temperature (filament power W) of the cathode 222 and sets it as the (n+1)th operating temperature (filament power W) of the cathode 222.

In the optical-axis adjustment step (S126), displacement of the optical axis due to having changed the emission current and the operating temperature (filament power W) is adjusted as needed.

Then, it returns to the current density J measurement step (S112), and each of the steps from the current density J measurement step (S112) to the optical-axis adjustment step (S126) is repeated until a measured current density enters a tolerance range in the determination step (S114). After the current density enters a tolerance range, it proceeds to the writing step (S130).

In the writing step (S130), the writing unit 150 writes a pattern on the target object 101, using an electron beam of the current density within a tolerance range. Specifically, it operates as follows: first, the writing data processing unit 122 inputs writing data (not shown) and performs data conversion processing of a plurality of steps for the writing data so as to generate apparatus-specific shot data. A plurality of figure patterns is usually defined in the writing data. In order to write a figure pattern by the writing apparatus 100, it needs to divide each figure pattern defined in the writing data to be the size that can be irradiated by one beam shot. Then, in the writing data processing unit 122, each figure pattern is divided into the size that can be irradiated by one beam shot so as to generate a shot figure in order to actually perform writing. Shot data is generated for each shot figure. Figure data, such as a figure kind, a figure size, and an irradiation position, for example, is defined in the shot data. In addition, dose (irradiation time) data etc. is also defined. The generated shot data is stored in a storage device (not shown). The writing unit 150 controlled by the writing control unit 124 through the control circuit 130 operates as follows according to the shot data.

In the electron gun 201, if the cathode 222 is heated at a set operating temperature (filament power W) when in the state in which a negative Wehnelt voltage (bias voltage) is applied to the Wehnelt 224 and a fixed negative acceleration voltage is applied to the cathode 222, electrons (electron group) are emitted from the cathode 222 and the emitted electrons (electron group) are accelerated by the acceleration voltage to become an electron beam advancing toward the anode 226. Thereby, the electron beam 200 is emitted from the electron gun 201. The bias voltage to be applied to the Wehnelt 224 is variably controlled by the bias voltage power circuit 234 so that an emission current which has been set may flow.

The electron beam 200 emitted from the electron gun 201 (emission unit) irradiates the whole of the first aperture 203 having a quadrangular opening by the illumination lens 202. At this point, the electron beam 200 is shaped to be a quadrangle. Then, after having passed through the first aperture 203, the electron beam 200 of the first aperture image is projected onto the second aperture 206 by the projection lens 204. The first aperture image on the second aperture 206 is deflected and controlled by the shaping deflector 205 so as to change the shape and size of the beam to be variably shaped. After having passed through the second aperture 206, the electron beam 200 of the second aperture image is focused by the objective lens 207, and deflected by the main deflector 214 and the sub deflector 212 to reach a desired position on the target object placed on the XY stage 105 which moves continuously. FIG. 1 shows the case of using multiple stage deflection of the main and sub deflection for position deflection. In such a case, the main deflector 214 may deflect the electron beam 200 of a shot concerned to a reference position in a subfield (SF), which is made by further virtually dividing a strip-shaped stripe region obtained by dividing the writing region of the target object into stripes, while following the movement of the stage, and the sub deflector 212 may deflect the shot beam concerned to each irradiation position in the SF.

After the writing step (S130), it periodically returns to the current density J measurement step (S112) and each of the steps from the current density J measurement step (S112) to the optical-axis adjustment step (S126) is repeated until a measured current density enters a tolerance range in the determination step (S114). Then, after the current density enters the tolerance range, it proceeds to the subsequent writing step (S130). Moreover, when a current density is adjusted after the writing step (S130) has been performed a plurality of times, there may be a case in which a measured current density does not enter a tolerance range in the determination step (S114) until a changed emission current value or filament power becomes out of tolerance in the determination step (S118) or the determination step (S122). In such a case, the approximate equation (1) may not have been established because degradation of the cathode 222 has proceeded. In that case, it is acceptable to newly carry out each step of FIG. 4. Thus, what is necessary is to execute each step of FIG. 4 according to the state of degradation of the cathode 222 until the cathode 222 becomes unusable.

As described above, according to the first embodiment, optimization of an optimum operating temperature of the electron gun cathode when adjusting an emission current can be achieved in a short time. Therefore, the adjustment time in obtaining a desired current density can be reduced.

Referring to specific examples, the embodiment has been described above. However, the present invention is not limited to these examples. The electron beam apparatus to which the selected cathode is applied is not limited to a writing apparatus, and the selected cathode can also be applied to other electron beam apparatus such as an electron microscope. As for the material used for the cathode, it is preferable to use a lanthanum hexaboride ($LaB_6$) crystal. It is also acceptable to use other thermionic emitting material such as tungsten (W) and cerium hexaboride ($CeB_6$) besides the $LaB_6$ crystal.

While the apparatus configuration, control method, and the like not directly necessary for explaining the present invention are not described, some or all of them may be suitably selected and used when needed. For example, although description of the configuration of a control unit for controlling the writing apparatus 100 is omitted, it should be understood that some or all of the configuration of the control unit is to be selected and used appropriately when necessary.

In addition, any other electron beam writing apparatus, electron beam writing method, and cathode operating temperature adjusting method that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A cathode operating temperature adjusting method comprising:
   acquiring an approximate equation that approximates a correlation between a value of an emission current in an electron beam source using a cathode and an operating temperature of the cathode at which a bias voltage becomes saturated at the emission current;
   measuring a current density of an electron beam emitted from the cathode when in a state in which an n-th emission current value, where n is a natural number, and an n-th operating temperature of the cathode are set in the electron beam source;
   determining whether the current density measured is within a range of a first tolerance;
   changing the n-th emission current value, which has been set, to an (n+1)th emission current value when the current density measured is not within the range of the first tolerance;
   calculating an operating temperature of the cathode corresponding to the (n+1)th emission current value by using the approximate equation;
   setting the operating temperature calculated, as an (n+1)th operating temperature of the cathode, in the electron beam source;
   measuring an operating temperature of the cathode at which a bias voltage becomes saturated at a maximum emission current value to be permitted; and
   measuring an operating temperature of the cathode at which a bias voltage becomes saturated at a minimum emission current value to be permitted,
   wherein the approximate equation is acquired by using the operating temperature of the cathode corresponding to the maximum emission current value and the operating temperature of the cathode corresponding to the minimum emission current value.

2. The method according to claim 1, further comprising:
   determining whether the operating temperature of the cathode calculated is within a range of a second tolerance,
   wherein an operating temperature of the cathode to be set in the electron beam source is adjusted within the range of the second tolerance.

3. The method according to claim 1, wherein the approximate equation is defined by a primary polynomial which is obtained by fitting a result of the measuring the operating temperature of the cathode corresponding to the maximum emission current value and the operating temperature of the cathode corresponding to the minimum emission current value.

4. The method according to claim 1, further comprising:
inputting a maximum emission current value to be permitted and a minimum emission current value to be permitted.

5. The method according to claim 1, further comprising:
determining whether the (n+1)th emission current value, changed from the n-th emission current value, is within a range of a third tolerance.

6. An electron beam writing apparatus comprising:
an electron beam source using a cathode;
a storage unit configured to store at least one of an approximate equation that approximates a correlation between a value of an emission current in the electron beam source and an operating temperature of the cathode at which a bias voltage becomes saturated at the emission current, and a coefficient of the approximate equation;
a determination unit configured to determine whether a current density of an electron beam emitted from the cathode is within a range of a first tolerance when in a state in which an n-th emission current value, where n is a natural number, and an n-th operating temperature of the cathode are set in the electron beam source;
an emission current setting change unit configured to change the n-th emission current value, which has been set, to an (n+1)th emission current value when the current density is not within the range of the first tolerance;
an acquisition unit configured to acquire an operating temperature of the cathode corresponding to the (n+1)th emission current value by using the approximate equation;
an operating temperature setting change unit configured to change the n-th operating temperature, which has been set in the electron beam source, to the operating temperature acquired as an (n+1)th operating temperature;
a writing unit configured to write a pattern on a target object with an electron beam whose current density is in the range of the first tolerance; and
an approximation calculation unit configured to perform a calculation for acquiring the approximate equation by using an operating temperature of the cathode corresponding to a maximum emission current value to be permitted and an operating temperature of the cathode corresponding to a minimum emission current value to be permitted.

7. The apparatus according to claim 6, further comprising:
a setting unit configured to input the maximum emission current value to be permitted and the minimum emission current value to be permitted, and to set at least one of the maximum emission current value and the minimum emission current value, as a target value.

8. The apparatus according to claim 6, further comprising:
a second determination unit configured to determine whether an acquired operating temperature of the cathode is within a range of a second tolerance.

9. An electron beam writing apparatus comprising:
an electron beam source using a cathode;
a storage means for storing at least one of an approximate equation that approximates a correlation between a value of an emission current in the electron beam source and an operating temperature of the cathode at which a bias voltage becomes saturated at the emission current, and a coefficient of the approximate equation;
a determination means for determining whether a current density of an electron beam emitted from the cathode is within a range of a first tolerance when in a state in which an n-th emission current value, where n is a natural number, and an n-th operating temperature of the cathode are set in the electron beam source;
an emission current setting change means for changing the n-th emission current value, which has been set, to an (n+1)th emission current value when the current density is not within the range of the first tolerance;
an acquisition means for acquiring an operating temperature of the cathode corresponding to the (n+1)th emission current value by using the approximate equation;
an operating temperature setting change means for changing the n-th operating temperature, which has been set in the electron beam source, to the operating temperature acquired as an (n+1)th operating temperature;
a writing means for writing a pattern on a target object with an electron beam whose current density is in the range of the first tolerance; and
an approximation calculation means for performing a calculation for acquiring the approximate equation by using an operating temperature of the cathode corresponding to a maximum emission current value to be permitted and an operating temperature of the cathode corresponding to a minimum emission current value to be permitted.

* * * * *